(12) United States Patent
Cui et al.

(10) Patent No.: US 11,894,546 B2
(45) Date of Patent: Feb. 6, 2024

(54) ATOMIC LAYER DEPOSITION OF STABLE LITHIUM ION CONDUCTIVE INTERFACIAL LAYER FOR STABLE CATHODE CYCLING

(71) Applicant: The Board of Trustees of the Leland Stanford Junior University, Stanford, CA (US)

(72) Inventors: Yi Cui, Stanford, CA (US); Jin Xie, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 205 days.

(21) Appl. No.: 16/616,933

(22) PCT Filed: May 10, 2018

(86) PCT No.: PCT/US2018/032008
§ 371 (c)(1),
(2) Date: Nov. 25, 2019

(87) PCT Pub. No.: WO2018/222366
PCT Pub. Date: Dec. 6, 2018

(65) Prior Publication Data
US 2020/0152976 A1 May 14, 2020

Related U.S. Application Data

(60) Provisional application No. 62/513,376, filed on May 31, 2017.

(51) Int. Cl.
*H01M 4/36* (2006.01)
*H01M 4/131* (2010.01)
(Continued)

(52) U.S. Cl.
CPC ............. *H01M 4/366* (2013.01); *C23C 16/30* (2013.01); *C23C 16/45531* (2013.01);
(Continued)

(58) Field of Classification Search
CPC .. H01M 4/366; H01M 4/0404; H01M 4/0428; H01M 4/131; H01M 4/1391;
(Continued)

(56) References Cited

U.S. PATENT DOCUMENTS 8,735,003 B2   5/2014   Kim et al.
8,894,723 B2   11/2014  Nilsen et al.
(Continued)

FOREIGN PATENT DOCUMENTS

CN   102610822   *   7/2012
CN   102610822 A     7/2012
(Continued)

OTHER PUBLICATIONS

JP 2009043477 MT (Year: 2009).*
(Continued)

*Primary Examiner* — Alexander Usyatinsky
(74) *Attorney, Agent, or Firm* — Foley & Lardner LLP

(57) ABSTRACT

A coated cathode material includes a cathode active material and an interfacial layer coating the cathode active material. The interfacial layer includes a lithium-containing fluoride which includes at least one additional metal different from lithium.

19 Claims, 14 Drawing Sheets

(51) Int. Cl.
*C23C 16/30* (2006.01)
*C23C 16/455* (2006.01)
*H01M 4/04* (2006.01)
*H01M 4/1391* (2010.01)
*H01M 4/505* (2010.01)
*H01M 4/525* (2010.01)
*H01M 4/62* (2006.01)
*H01M 10/0525* (2010.01)

(52) U.S. Cl.
CPC .. *C23C 16/45553* (2013.01); *C23C 16/45555* (2013.01); *H01M 4/0404* (2013.01); *H01M 4/0428* (2013.01); *H01M 4/131* (2013.01); *H01M 4/1391* (2013.01); *H01M 4/505* (2013.01); *H01M 4/525* (2013.01); *H01M 4/628* (2013.01); *H01M 10/0525* (2013.01)

(58) Field of Classification Search
CPC ...... H01M 4/505; H01M 4/525; H01M 4/628; H01M 10/0525; C23C 16/30; C23C 16/45531; C23C 16/45553; C23C 16/45555
See application file for complete search history.

(56) References Cited

U.S. PATENT DOCUMENTS

| | | | |
|---|---|---|---|
| 9,059,451 | B2 | 6/2015 | Xiao et al. |
| 9,531,004 | B2 | 12/2016 | Xiao et al. |
| 9,570,734 | B2 | 2/2017 | Kelder et al. |
| 9,570,748 | B2 | 2/2017 | Dudney et al. |
| 2016/0351973 | A1* | 12/2016 | Albano ............... H01M 4/628 |
| 2017/0125809 | A1* | 5/2017 | Kim ..................... C01G 53/00 |
| 2017/0317349 | A1* | 11/2017 | Ju ........................ C01G 53/50 |

FOREIGN PATENT DOCUMENTS

| | | | |
|---|---|---|---|
| JP | 2009043477 | * | 2/2009 |
| JP | 2017-509112 A | | 3/2017 |
| KR | 10-2017-0008164 A | | 1/2017 |
| WO | WO 2017/025957 | * | 2/2017 |
| WO | WO-2017/025957 A1 | | 2/2017 |

OTHER PUBLICATIONS

CN 102610822 (Year: 2012).*
International Preliminary Report on Patentability issued in PCT Application No. PCT/US2018/032008 dated Dec. 12, 2019, 8 pages.
Cho, J. et al., "Novel LiCoO2 Cathode Material with Al2O3 Coating for a Li Ion Cell", Chem. Mater. 2000, vol. 12, No. 12, pp. 3788-3791.
Ding, F. et al., "Enhanced performance of graphite anode materials by AlF3 coating for lithium-ion batteries", J. Mater. Chem. 2012, 22, pp. 12745-12751.
International Search Report and Written Opinion issued in PCT/US2018/032008 dated Feb. 26, 2019, 11 pages.
Jung, Y. S., et al. "Enhanced Stability of LiCoO2 Cathodes in Lithium-Ion Batteries Using Surface Modification by Atomic Layer Deposition", J. Electrochem. Soc. 2010, 157, pp. A75-A81.
Li, C., et al. "Cathode materials modified by surface coating for lithium ion batteries", Electrochim Acta 2006, 51, pp. 3872-3883.
Sun, Y.-K. et al., "AlF3-Coating to Improve High Voltage Cycling Performance of Li[Ni1/3Co1/3Mn1/3]O2 Cathode Materials for Lithium Secondary Batteries", J. Electrochem. Soc. 2007, 154, pp. A168-A172.
Sun, Y.-K., et al., "Synthesis and Characterization of Li[(Ni0.8Co0.1Mn0.1)0.8(Ni0.5Mn0.5)0.2]O2 with the Microscale Core-Shell Structure as the Positive Electrode Material for Lithium Batteries", J. Am. Chem. Soc. 2005, 127, pp. 13411-13418.
Wang, H., et al., "Effect of LiFePO4 coating on electrochemical performance of LiCoO2 at high temperature", Solid State Ion. 2007, 178, pp. 131-136.
Xie, Jin et al., "Atomic layer deposition of stable LiAlF4 lithium ion conductive interfacial layer for stable cathode cycling", ACS Nano, 2017 (Published date: Jun. 30, 2017), vol. 11, No. 7, pp. 7019-7027.

* cited by examiner

| Compounds | Formation/Decomposition (Energy/Atom) (eV)* | $\Delta_r G^0$ (kJ/mol)* | $\Delta_r G^0$ (kJ/mol)# |
|---|---|---|---|
| LiF | -3.18 | -613.6 | -587.7 |
| AlF$_3$ | -3.891 | -1501.7 | -1431.1 |
| Li$_3$AlF$_6$ | -3.499 | -3376.0 | -3152 |
| LiAl | -0.179 | -34.5 | N/A |
| Li$_3$Al$_2$ | -0.181 | -87.3 | N/A |
| Li$_9$Al$_4$ | -0.156 | -195.7 | N/A |

ATOMIC LAYER DEPOSITION OF STABLE LITHIUM ION CONDUCTIVE INTERFACIAL LAYER FOR STABLE CATHODE CYCLING

CROSS-REFERENCE TO RELATED APPLICATION

This application is a National Stage Entry of PCT/US2018/032008, filed May 10, 2018, which claims the benefit of and priority to U.S. Provisional Application No. 62/513,376, filed May 31, 2017, the contents of which are incorporated herein by reference in their entirety.

STATEMENT REGARDING FEDERALLY SPONSORED RESEARCH OR DEVELOPMENT

This invention was made with Government support under contract DE-AC02-76SF00515 awarded by the Department of Energy. The Government has certain rights in the invention.

BACKGROUND

Driven by increasing energy storage demands in consumer electronics, electrical vehicles and even grid scale power, modern lithium ion batteries are often desired to operate at wide electrochemical windows for enhanced specific capacities and higher voltage outputs. Operating at extreme voltages posts grand challenges in the field of materials research, as issues with instability plague electrodes, electrolytes and their interfaces. To maintain a long cycle life, developing a stable interfacial layer is desired, as degradation typically starts to propagate where an electrode and an electrolyte meet. The accumulation of byproducts at the interface leads to high internal resistance, which can eventually cause battery failure. Great efforts have been devoted to achieve a stable interfacial layer. An example of such is a solid electrolyte interphase (SEI) formation on a graphite anode. On a cathode side, developing a stable interfacial layer is more and more important as its instability has becoming a constraining factor for batteries to operate safely for tens of years, especially when cut-off potentials have been aggressively pushed to more positive for greater energy output.

It is against this background that a need arose to develop embodiments of this disclosure.

SUMMARY

In some embodiments, a coated cathode material includes a cathode active material and an interfacial layer coating the cathode active material. The interfacial layer includes a lithium-containing fluoride which includes at least one additional metal different from lithium.

In some embodiments, a method of forming a coated cathode material includes providing a cathode active material and forming, via atomic layer deposition, an interfacial layer coating the cathode active material. The interfacial layer includes a lithium-containing fluoride which includes at least one additional metal different from lithium.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DESCRIPTION

Figure 14:
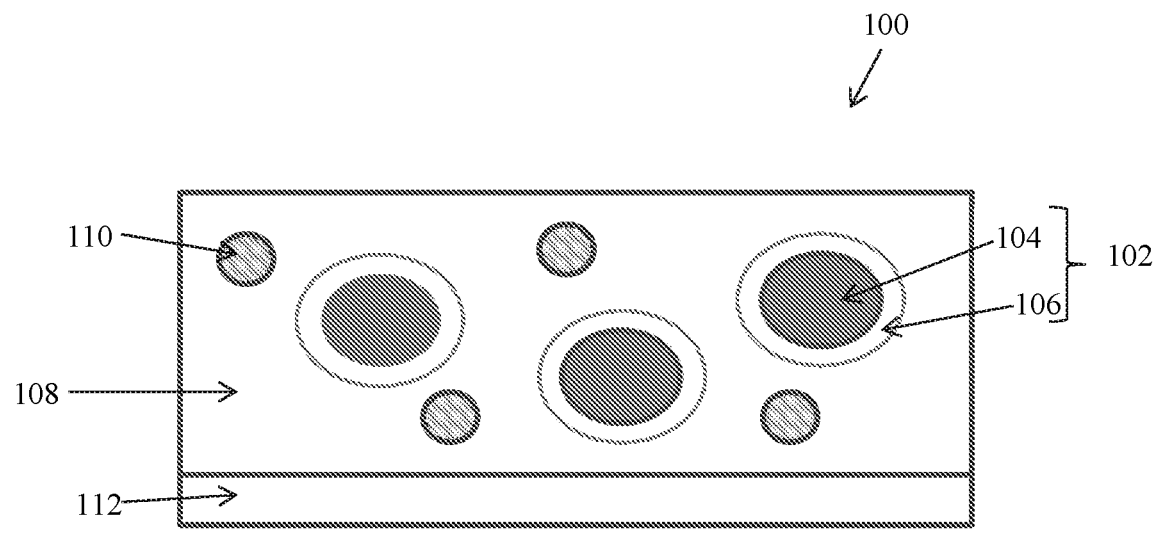
FIG. 14. Cathode including a coated cathode material according to some embodiments.
Figure 15:
FIG. 15. Coated cathode material according to other embodiments.

Cathode Including a Coated Cathode Material:

FIG. 14 shows a cathode 100 including a coated cathode material 102 according to some embodiments. In some embodiments, the coated cathode material 102 includes particles 104 of a cathode active material, and an interfacial layer 106 which conformally coats or covers individual ones of the particles 104. In some embodiments, the cathode 100 also includes a polymeric binder 108 and conductive additives 110, such as carbonaceous or metallic additives, and the particles 104 each coated with the interfacial layer 106 are dispersed in the polymeric binder 108 along with the conductive additives 110, which are disposed over or adjacent to a current collector 112. In other embodiments as shown in FIG. 15, the coated cathode material 102 can take on other shapes or configurations, such as a planar configuration of a film 114 including the cathode active material, and the interfacial layer 106 which coats or covers a surface of the film 114.

In some embodiments of the coated cathode material 102, the cathode active material is a layered lithium transition metal oxide, such as a lithium nickel manganese cobalt oxide represented as LiNi$_x$Mn$_y$Co$_z$O$_2$ where x+y+z=1 (e.g., LiNi$_{0.8}$Mn$_{0.1}$Co$_{0.1}$O$_2$). Other cathode active materials are encompassed by this disclosure, such as lithium cobalt oxide (e.g., LiCoO$_2$), lithium iron phosphate (e.g., LiFePO$_4$), and lithium manganese oxide (e.g., LiMn$_2$O$_4$). In some embodiments, the particles 104 of the cathode active material are provided as micron-sized particles, but also can be provided as nano-sized particles. For example, the particles 104 can have sizes in a range of about 10 nm to about 100 μm, such as about 10 nm to about 500 nm, about 500 nm to about 1 μm, about 500 nm to about 10 μm, about 1 μm to about 10 μm, or about 10 μm to about 100 μm.

In some embodiments of the coated cathode material 102, the interfacial layer 106 includes a lithium-containing compound. In some embodiments, the lithium-containing compound is a lithium-containing halide, such as a lithium-containing fluoride. In some embodiments, the lithium-containing compound, such as a lithium-containing fluoride, includes at least one additional metal different from lithium. In some embodiments, the additional metal is a Group 13 metal, such as aluminum. In some embodiments, the additional metal is another post-transition metal or a transition metal. In some embodiments, the lithium-containing compound is a lithium aluminum fluoride represented as Li$_x$Al$_y$F$_z$ where 0.5≤x≤3.5 (or 0.5≤x≤1.5 or 1≤x≤1.4 or 2.5≤x≤3.5 or 2.8≤x≤3.2), 0.5≤y≤1.5 (or 0.8≤y≤1.2), and 3.5≤z≤6.5 (or 3.5≤z≤5 or 4≤z≤4.8 or 5.5≤z≤6.5 or 5.8≤z≤6.2). In some embodiments, an atomic ratio of Li:Al (or x/y) is about 1 or greater than about 1, such as about 2 or greater, about 2.5 or greater, or about 3 or greater. In some embodiments, an atomic ratio of F:Li (or z/x) is about 1 or greater than about 1, such as about 1.5 or greater, about 2 or greater, or about 3 or greater, or about 4 or greater. For example, the lithium-containing compound is LiAlF$_4$ or Li$_3$AlF$_6$. Other ternary or higher order compounds are encompassed by this disclosure. Also, the above relationships expressed with respect to Al is more generally applicable to other metals included as the additional metal different from lithium.

In some embodiments of the coated cathode material 102, the lithium-containing compound has a lithium ion conductivity of at least about 1×10$^{-10}$ S/cm, at least about 5×10$^{-10}$ S/cm, at least about 1×10$^{-9}$ S/cm, at least about 5×10$^{-9}$ S/cm, at least about 1×10$^{-8}$ S/cm, or at least about 3×10$^{-9}$ S/cm, as measured at 25° C.

In some embodiments of the coated cathode material 102, the lithium-containing compound has a reduction potential no greater than about 2.8 V vs. Li/Li$^+$, no greater than about 2.7 V vs. Li/Li$^+$, no greater than about 2.6 V vs. Li/Li$^+$, no greater than about 2.5 V vs. Li/Li$^+$, no greater than about 2.4 V vs. Li/Li$^+$, no greater than about 2.3 V vs. Li/Li$^+$, no greater than about 2.2 V vs. Li/Li$^+$, or no greater than about 2.1 V vs. Li/Li$^+$. In some embodiments, the lithium-containing compound has an oxidation potential of at least about 4.5 V vs. Li/Li$^+$, at least about 4.7 V vs. Li/Li$^+$, at least about 4.9 V vs. Li/Li$^+$, at least about 5.1 V vs. Li/Li$^+$, at least about 5.3 V vs. Li/Li$^+$, at least about 5.5 V vs. Li/Li$^+$, or at least about 5.7 V vs. Li/Li$^+$.

In some embodiments of the coated cathode material 102, a thickness of the interfacial layer 106 is in a range of about 1 nm to about 200 nm, such as about 1 nm to about 150 nm, about 1 nm to about 100 nm, about 1 nm to about 80 μm, about 1 nm to about 60 μm, about 1 nm to about 40 nm, about 1 nm to about 20 nm, or about 1 nm to about 10 nm.

In some embodiments of the coated cathode material 102, the lithium-containing compound is at least primarily crystalline by weight or volume, such as at least about 51%, at least about 55%, at least about 60%, at least about 70%, or at least about 80%. In some embodiments, the interfacial layer 106 is at least primarily amorphous by weight or volume.

Method of Forming a Coated Cathode Material:

In some embodiments, a method of forming a coated cathode material includes providing a cathode active material, and forming, via atomic layer deposition, an interfacial layer which coats or covers the cathode active material. In some embodiments, the cathode active material is provided as particles of the cathode active material, and the interfacial layer is formed so as to coat or cover individual ones of the particles. In other embodiments, the cathode active material can take on other shapes or configurations, such as a planar configuration of a film including the cathode active material, and the interfacial layer is formed so as to coat or cover a surface of the film.

In some embodiments of the method, the interfacial layer includes a lithium-containing compound. In some embodiments, the lithium-containing compound is a lithium-containing halide, such as a lithium-containing fluoride. In some embodiments, the lithium-containing compound, such as a lithium-containing fluoride, includes at least one additional metal different from lithium. In some embodiments, the additional metal is a Group 13 metal, such as aluminum. In some embodiments, the additional metal is another post-transition metal or a transition metal. In some embodiments, the lithium-containing compound is a lithium aluminum fluoride represented as $Li_xAl_yF_z$ where $0.5 \leq x \leq 3.5$ (or $0.5 \leq x \leq 1.5$ or $1 \leq x \leq 1.4$ or $2.5 \leq x \leq 3.5$ or $2.8 \leq x \leq 3.2$), $0.5 \leq y \leq 1.5$ (or $0.8 \leq y \leq 1.2$), and $3.5 \leq z \leq 6.5$ (or $3.5 \leq z \leq 5$ or $4 \leq z \leq 4.8$ or $5.5 \leq z \leq 6.5$ or $5.8 \leq z \leq 6.2$). In some embodiments, an atomic ratio of Li:Al (or x/y) is about 1 or greater than about 1, such as about 2 or greater, about 2.5 or greater, or about 3 or greater. In some embodiments, an atomic ratio of F:Li (or z/x) is about 1 or greater than about 1, such as about 1.5 or greater, about 2 or greater, or about 3 or greater, or about 4 or greater. For example, the lithium-containing compound is $LiAlF_4$ or $Li_3AlF_6$. Other ternary or higher order compounds are encompassed by this disclosure. Also, the above relationships expressed with respect to Al is more generally applicable to other metals included as the additional metal different from lithium.

In some embodiments of the method, the method of forming the coated cathode material includes sequentially performing a first atomic layer deposition cycle to deposit a lithium-containing fluoride on the cathode active material, followed by performing a second atomic layer deposition cycle to deposit a fluoride containing the additional metal, such as an aluminum-containing fluoride. The first deposition cycle and the second deposition cycle can be repeated sequentially to form the interfacial layer having a desired thickness. It is noted that the first deposition cycle can be repeated multiple times before the second deposition cycle, and that the second deposition cycle can be repeated multiple times before the first deposition cycle. It is also noted that either deposition cycle can be performed first.

In some embodiments of the method, performing the first deposition cycle includes sequentially introducing deposition gases of chemical precursors or reactants including a first precursor and a second precursor. In the case of the lithium-containing fluoride, the first precursor is a lithium-containing precursor, and the second precursor is a fluorine-containing precursor.

In some embodiments of the method, performing the second deposition cycle includes sequentially introducing deposition gases of chemical precursors or reactants including a third precursor and a fourth precursor. In the case of the fluoride containing the additional metal which is aluminum, the third precursor is an aluminum-containing precursor, and the fourth precursor is a fluorine-containing precursor.

Figure 16:
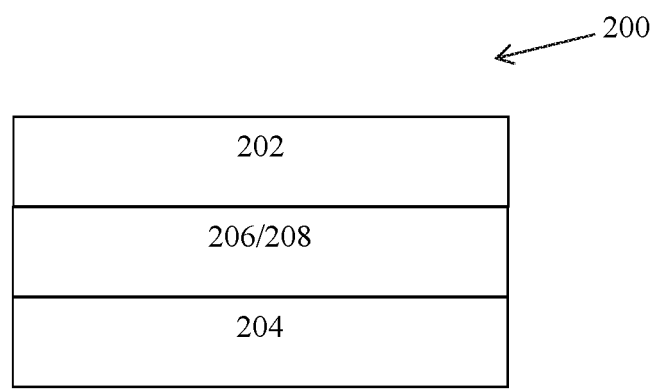
FIG. 16. Battery including a coated cathode material according to some embodiments.

Electrochemical Energy Storage Devices:

The cathodes and coated cathode materials described herein can be used for a variety of batteries and other electrochemical energy storage devices. For example, the cathodes can be substituted in place of, or used in conjunction with, other electrodes for lithium ion batteries or other types of batteries. As shown in some embodiments of FIG. 16, a resulting battery 200 includes a cathode 202, an anode 204, and a separator 206 that is disposed between the cathode 202 and the anode 204. The battery 200 also includes an electrolyte 208, which is disposed between the cathode 202 and the anode 204. The cathode 202 can include a coated cathode material as described herein.

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Atomic Layer Deposition of $LiAlF_4$ Lithium Ion Conductive Interfacial Layer for Stable Cathode Cycling Overview:

Modern lithium ion batteries are often desired to operate at a wide electrochemical window to maximize energy densities. While pushing cut-off potentials allows a battery to provide greater energy densities with enhanced specific capacities and higher voltage outputs, it raises challenges with thermodynamic and kinetic stability in the battery. This is especially true for layered lithium transition metal oxides, where capacities can improve but stabilities are compromised as wider electrochemical windows are applied. In some embodiments, atomic layer deposition is used to develop a $LiAlF_4$ solid thin film with robust stability and good ion conductivity, which is superior to LiF and $AlF_3$. With a predicted stable electrochemical window of about 2.0-5.7 V vs. $Li^+$/Li for $LiAlF_4$, excellent stability can be achieved for high Ni content $LiNi_{0.8}Mn_{0.1}Co_{0.1}O_2$ electrodes with $LiAlF_4$ interfacial layer at a wide electrochemical window of about 2.75-4.50 V vs. $Li^+$/Li.

INTRODUCTION

To address the challenge of a stable interfacial layer on a cathode side, methods including surface coating, surface modification by doping, and electrolyte additive formulation have been proposed. Thin films including $Al_2O_3$, $AlF_3$, and lithium-containing compounds can be deposited using different coating methods with varying levels of successes. However, a superior film which satisfies various criteria simultaneously including being electrochemically inert, chemically stable, lithium ion conductive and highly uniform is still desired. In some embodiments, a $LiAlF_4$ thin film is prepared by atomic layer deposition (ALD), which satisfies all four criteria mentioned above for a cathode to operate at wide electrochemical windows. Evaluation is made of the effect of coating on high Ni content $LiNi_{0.8}Mn_{0.1}Co_{0.1}O_2$ (NMC-811) cycled at about 2.75-4.50 V vs. $Li^+$/Li. The high Ni content layered lithium transition metal oxides have attracted great interest owing to their high capacity and low cost. However, the replacement of Co with Ni reduces the structural stability, especially at high applied potentials and on interfaces. The film that is developed served as a stable and lithium permeable interfacial layer for NMC-811. Good cycling stability can be obtained for 300 cycles with capacity retention higher than about 99.9% per cycle at a wide electrochemical window of about 2.75-4.50 V vs. $Li^+$/Li.

Experiments and Discussions:

An interface between an electrode and an electrolyte is one of the most important components of a battery. It should be stable enough to withstand years of battery operation without degradation while retaining low resistance for lithium ions to diffuse through. Therefore, in order for an interfacial layer to operate properly to enhance the stability of a cathode rather than to constrain its performance, certain criteria should be met simultaneously.

Figure 1:
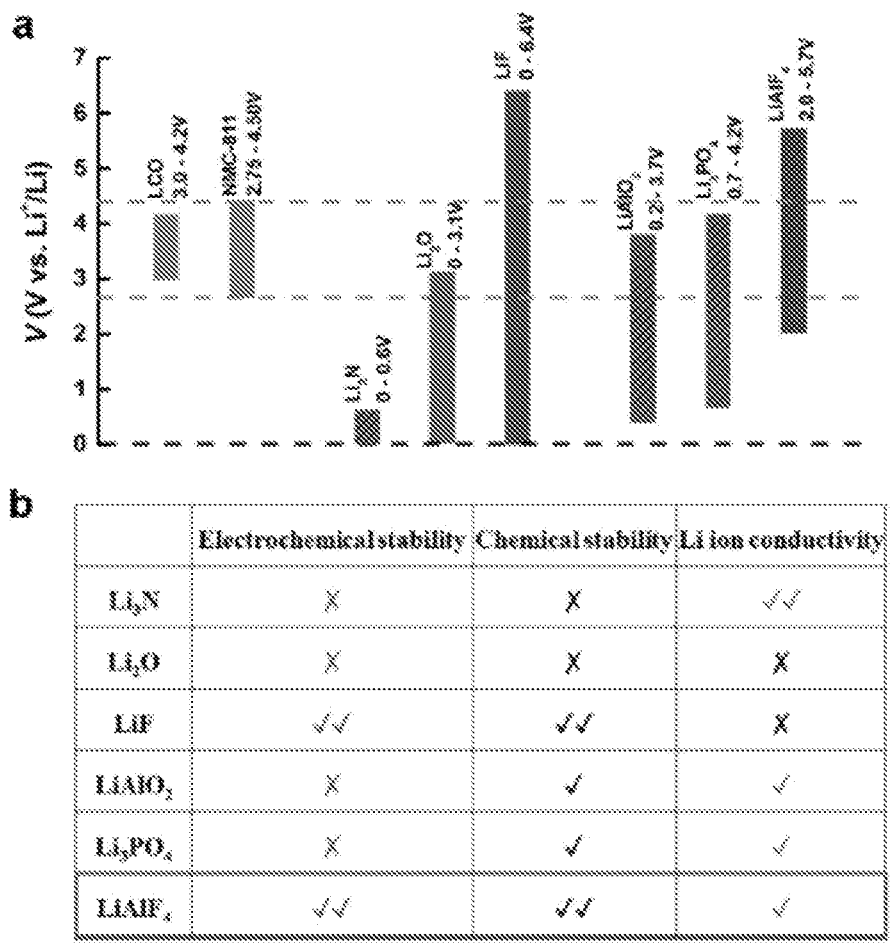
FIG. 1. (a) Calculated electrochemical stability windows of $Li_3N$, $Li_2O$, $LiF$, $LiAlO_2$, $LiPO_4$ and $LiAlF_4$. The windows of the first five candidates are reported values (see the methods section and supporting information for detailed calculation of the decomposition potentials and reactions); Density functional theory (DFT) is used to calculate the window of $LiAlF_4$. The operating electrochemical window of $LiNi_{0.8}Mn_{0.1}CO_{0.1}O_2$ (NMC-811) and typical operation electrochemical window of $LiCoO_2$ are included for comparison; (b) selection criteria (chemical stability, electrochemical stability and Li ion conductivity) of a few interfacial materials.

Firstly, the interfacial layer should be electrochemically and chemically stable to withstand harsh battery operation conditions. To avoid the risk of decomposition by reduction or oxidation during cycling, an electrochemical stability window of the interfacial layer should be wide enough so that it doesn't participate in redox reactions. In FIG. 1a, the stability windows of a few candidate lithium-containing compounds for this purpose are provided, using the formation energy reported in the Materials Project database. Among them, nitrides (e.g., $Li_3N$, 0-0.6 V vs. $Li^+$/Li), oxides (e.g., $Li_2O$, 0-3.1 V vs. $Li^+$/Li; $LiAlO_2$, 0.2-3.7 V vs. $Li^+$/Li), and phosphates (e.g., $Li_3PO_4$, 0.7-4.2 V vs. $Li^+$/Li) are thermodynamically unstable (see supporting information for detailed calculation) in the range where lithiation/delithiation of layered lithium transition metal oxides takes place, and therefore are prone to be decomposed by oxidation with years of battery operation. For comparison, fluorides are promising due to their superior stability. The stability window is as wide as about 0-6.4 V vs. $Li^+$/Li for LiF, a binary fluoride compound. Using these same methods, it can be found that the stability window of fluorides remains wide even with the addition of secondary metal ions. Density functional theory (DFT) calculations on $LiAlF_4$ are performed to find a formation energy of about −3.547 eV/atom or about −2053.4 kJ/mol for $LiAlF_4$ and predict an electrochemical window of about 2.0-5.2 V vs. $Li^+$/Li (see supporting information for detailed calculation). As seen in the far right bar in FIG. 1a, the calculations indicate $LiAlF_4$ is thermodynamically stable in the entire operation window of the layered lithium transition metal oxides, unlike most other candidates. In addition to its wide electrochemical window, fluoride compounds have superior chemical stability at an interface when compared with other chemical compositions. For example, oxides and nitrides can be attacked by trace amounts of $H_2O$ and HF in an electrolyte. Even in ambient air, fluorides are considered to be more resistant against moisture and $CO_2$ than oxides and nitrides, which makes the handling and processing of coated electrodes easier.

Secondly, the interfacial layer should be lithium ion conductive to maintain a power density of a battery. An uniform coating of poor lithium ion conductors such as metal oxides or fluorides (e.g., $Al_2O_3$ and $AlF_3$) can induce an increased overpotential and a reduced capacity. In order to reduce the ion resistance, lithium-containing thin films (e.g., $Li_3N$, LiF, $LiAlO_2$, LiPON, and $LiFePO_4$) can be considered. Among them, fluorides are particularly promising due to the above mentioned stability. While LiF is a poor lithium ion conductor, mixing LiF with divalent fluoride or trivalent fluoride can yield improved lithium ion conductivity.

In addition, the interfacial layer should be substantially uniform across a large high surface area of an electrode. While solution phase coating methods on individual particles of cathode materials holds advantages of being cost effective and ready integration for large scale production, non-uniformity may be present upon post-growth annealing and film cracking may take place during slurry making and/or calendaring processes. And due to the complexity and compatibility of synthesis, $LiAlF_4$ synthesis can be performed by physical evaporation. However, evaporation methods constrain the application of $LiAlF_4$ to devices with a planar geometry. Compared to the above-mentioned methods, ALD is particularly positioned to achieve uniform coating on high surface area electrodes directly.

Figure 2:
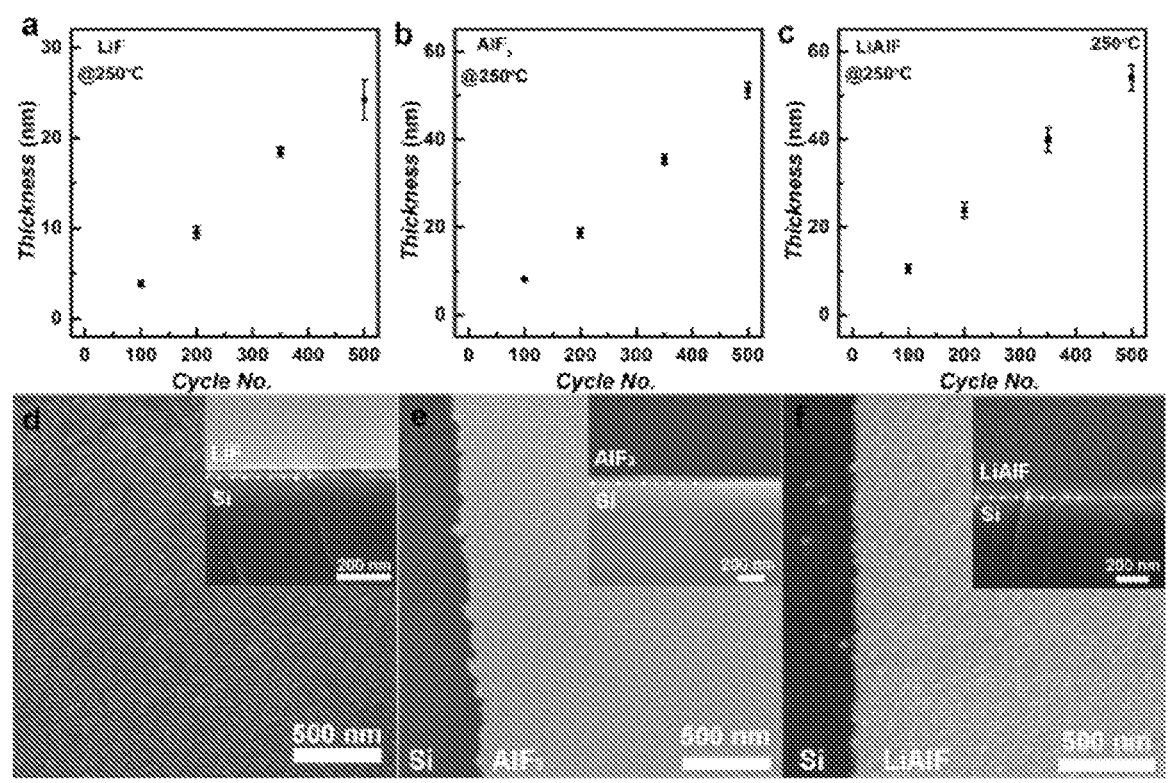
FIG. 2. (a-c) Thickness characterizations of LiF, $AlF_3$ and $LiAlF_4$ films with different atomic layer deposition (ALD) cycle numbers. (d-f) Scanning electron microscopy (SEM) characterizations of ALD grown LiF, $AlF_3$ and $LiAlF_4$ films on silicon wafers. Inset images are cross section views.

In some embodiments, a LiF ALD chemistry is developed based on lithium tert-butoxide as a lithium source. Lithium tert-butoxide (LiOtBu) has a relatively high vapor pressure and good thermal stability among different lithium organo-metallic compounds. LiF thin films can be acquired at growth temperatures ranging from about 200 to about 300° C. (see supporting information for more details). The highest growth rate achieved was about 0.5 Å per ALD cycle at about 250° C. At about 250° C., the coverage of LiF deposition is uniform and featured small grains (FIG. 2d). $AlF_3$ deposition was performed following reported methods. The deposition rate of $AlF_3$ at about 250° C. is close to about 1 Å per ALD cycle. Unlike LiF which shows individual grains, an $AlF_3$ film prepared by ALD is uniform and featureless (FIG. 2e). ALD provides great flexibility to prepare complex films by integrating different procedures. In some embodiments, a $LiAlF_4$ film was prepared by introducing alternative sub-cycles of LiF (LiOtBu and $TiF_4$) and $AlF_3$ ($AlCl_3$ and $TiF_4$). The $LiAlF_4$ prepared by this method is substantially uniform (FIG. 2f), and its thickness increased linearly with total ALD cycles (FIG. 2c).

Figure 3:
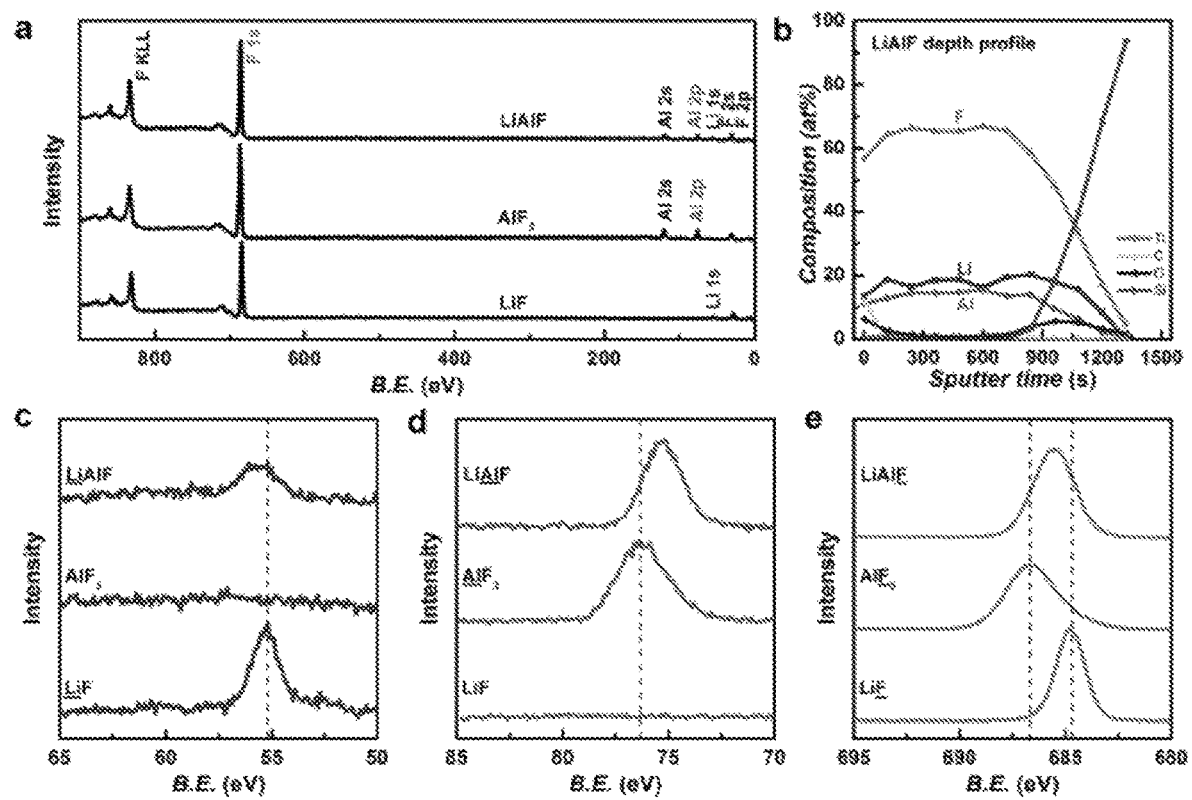
FIG. 3. X-ray photoelectron spectroscopy (XPS) Characterizations. (a) XPS characterizations of ALD grown LiF, $AlF_3$ and $LiAlF_4$ films; (b) depth profile of $LiAlF_4$ film prepared by ALD; (c-e) fine XPS scans of Li 1 s peaks, Al 2p peaks and F 1s peaks of LiF, $AlF_3$ and $LiAlF_4$ films.

X-ray photoelectron spectroscopy (XPS) characterizations were carried out to analyze chemical compositions of ALD grown films (FIG. 3). The ALD LiF film showed a distinct Li is peak and F is peak at about 55.3 eV and about 684.8 eV, both agreeing well with reported values for bulk LiF. The ALD $AlF_3$ film showed a clear Al 2p peak at about 76.2 eV, also in agreement with a reported value for bulk $AlF_3$. Due to the higher electronegativity of Al compared to Li, the F 1s peak in $AlF_3$ shifted to higher binding energy compared to the F is peak in LiF. The observed peak position of about 686.5 eV was close to the F 1s peak in $\alpha$-$AlF_3$. ALD $LiAlF_4$ film had all three elements with Li 1 s, Al 2p and F 1s peaks at about 55.6 eV, about 75.3 eV and about 685.5 eV. Compared to ALD LiF and $AlF_3$ films, the Li 1 s peak in the $LiAlF_4$ film shifted to higher binding energy and the Al 2p peak in the $LiAlF_4$ film shifted to lower binding energy. The F is peak in $LiAlF_4$ film also shifted to higher binding energy compared to the F 1s peak in LiF, but lower binding energy compared to the F is peak in $AlF_3$. The peak position analysis demonstrated that the $LiAlF_4$ film forms a single chemical composition rather than a physical mixture of LiF and $AlF_3$.

The depth profile of the $LiAlF_4$ film was also investigated (FIG. 3b). The C and O impurities on the surface were low and quickly disappeared after a first sputtering cycle, indicating the nature of surface absorbed impurities. Ti, C and O impurities remained low throughout the entire film. The Li:Al:F atomic ratio was consistent across different film depths with an average being about 1.2:about 1.0:about 4.5 according to XPS. For comparison, the F/Li atomic ratio in ALD LiF film and F/Al atomic ratio in ALD $AlF_3$ film were about 0.97 and about 3.45, respectively (see supporting information). $AlF_3$ ALD can show excess of fluorine compared to metal ions. The excess of fluorine may create metal vacancies in ALD grown films for enhanced lithium ion conductivity.

Figure 4:
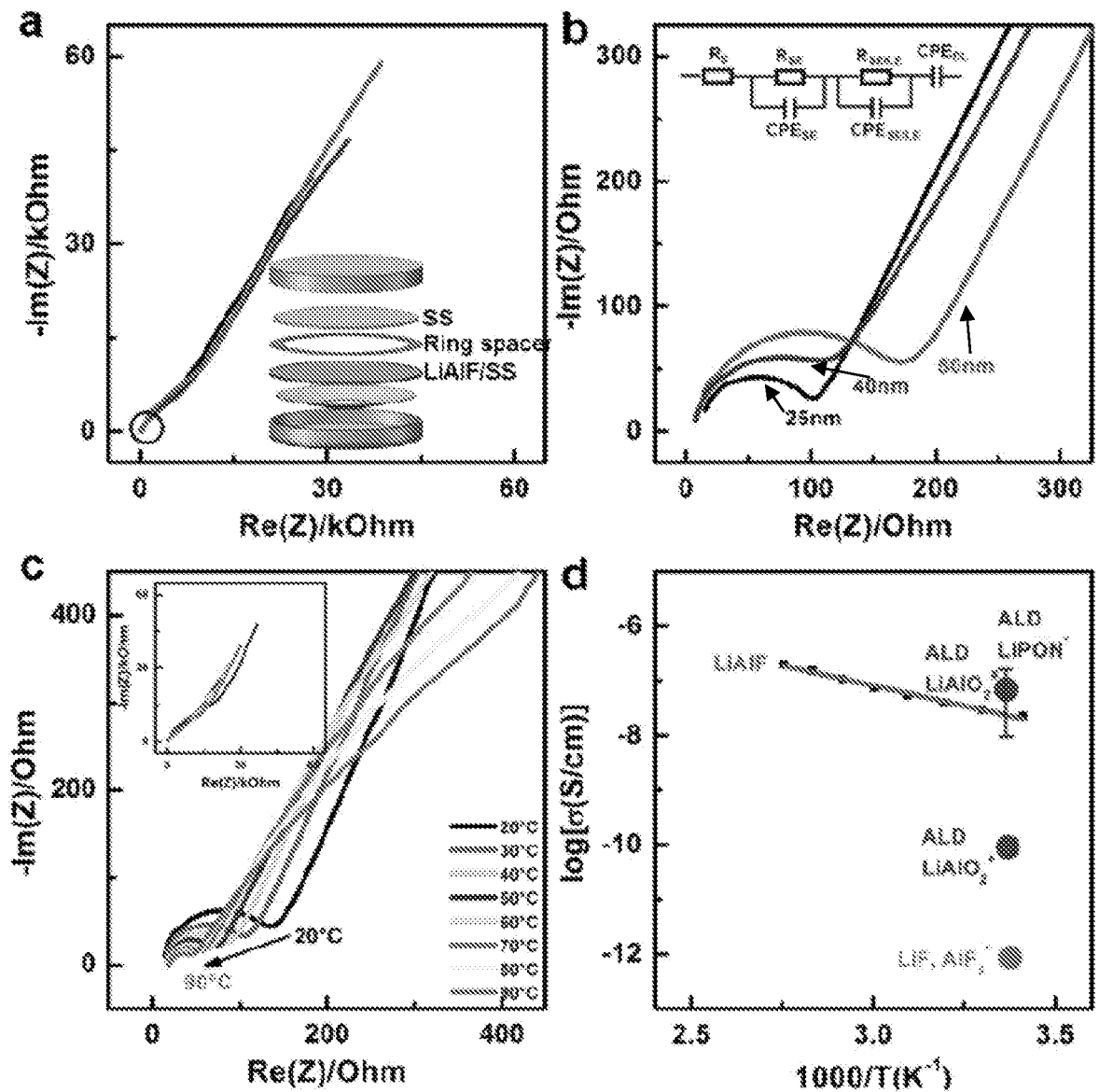
FIG. 4. (a) Electrochemical impedance spectroscopy (EIS) characterizations of $LiAlF_4$ films with different thicknesses at room temperature—inset shows the EIS characterization setup; (b) enlarged EIS spectra shown in FIG. 4a—inset shows the corresponding circuit; (c) EIS characterizations at different temperatures; (d) conductivity vs. temperature plot of $LiAlF_4$ film and reported lithium ion conductivities of evaporated LiF and $AlF_3$ films, ALD deposited $LiAlO_2$ and ALD deposited lithium phosphorus oxynitride (LiPON) films.

The lithium ion conductivity of ALD $LiAlF_4$ film was tested by depositing films with different thicknesses onto stainless steel substrates, which were then assembled into coin cells (the setup is shown as an inset of FIG. 4a). FIGS. 4a and 4b show electrochemical impedance spectroscopy (EIS) spectra of $LiAlF_4$ films as a function of film thickness. The conductivity was determined to be $3.5\pm0.5\times10^{-8}$ S/cm using a corresponding circuit model shown as an inset of FIG. 4b. The corresponding circuit includes two parallel R/CPE at both high ($CPE_{SE}/R_{SE}$) and medium ($CPE_{SE/LE}/R_{SE/LE}$) frequencies. $CPE_{SE}/R_{SE}$ describes ionic conduction processes in the $LiAlF_4$ film and $CPE_{SE/LE}/R_{SE/LE}$ describes ionic conduction processes across the solid electrolyte interface. Additionally, $R_0$ is used to describe the electrolyte and contact resistance; and $CPE_{DL}$ is used to describe the capacitance at the electrode interface. The measured lithium ion conductivity of ALD $LiAlF_4$ is four orders of magnitude higher than that reported for LiF or $AlF_3$. For comparison purposes, the lithium ion conductivities of other lithium containing films (LiPON and $LiAlO_2$) prepared by ALD are also plotted in FIG. 4d. The conductivity of $LiAlF_4$ reported here is close to ALD grown LiPON. However, the advantage of using $LiAlF_4$ is its wide electrochemical stability window, which allows it to be used as a protection film on cathode materials without being oxidized or reduced.

High Ni content layered lithium transition metal oxides are attractive and promising due to low cost and high capacity. Although NMC-811 (about 80% Ni content, see supporting information for basic material characterization of NMC-811 tested) can deliver a capacity exceeding about 200 mAh/g at a wide electrochemical window (about 2.75-4.50 V vs. $Li^+/Li$), it can be constrained to cycle at a much narrower electrochemical window to maintain proper long-term stability (see supporting information for its cycle stabilities at different electrochemical windows). The fast capacity decay is related to its interface instability when cycled at a wide electrochemical window. In some embodiments, the long-term stability has been improved significantly and rate performance has not been compromised when an $LiAlF_4$ interfacial layer was applied using ALD.

Figure 5:
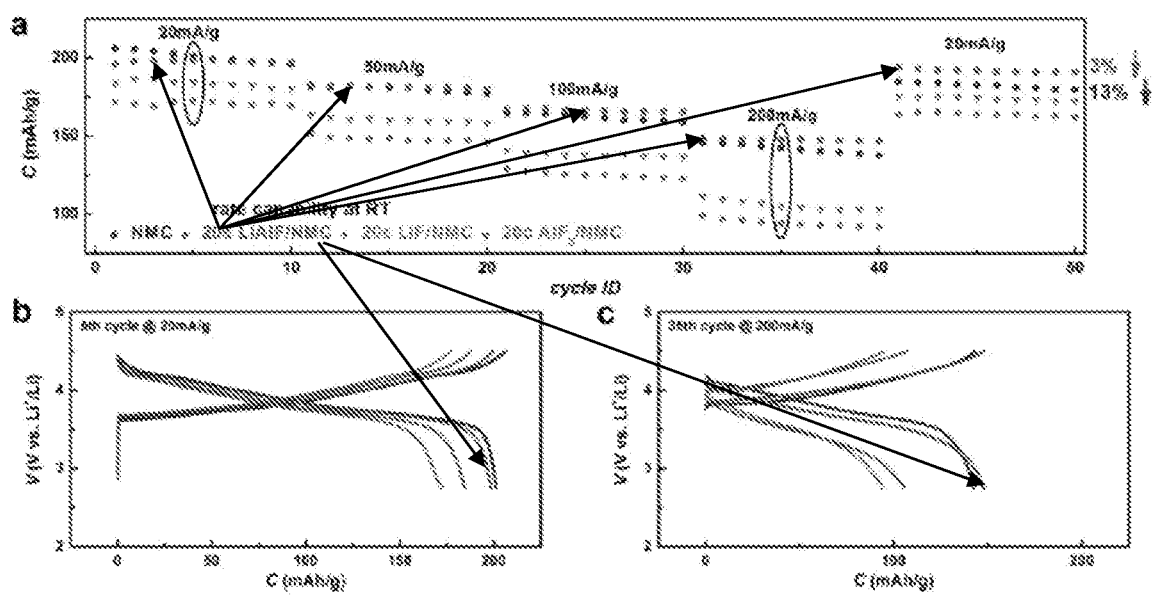
FIG. 5. (a) Rate performance of pristine, 20 cycles ALD $LiAlF_4$ coated, 20 cycles ALD LiF coated, 20 cycles ALD $AlF_3$ coated NMC-811 electrodes at room temperature with an electrochemical window of about 2.75-4.50 V vs. $Li^+/Li$; (b, c) voltage vs. capacity plots of pristine, 20 cycles ALD $LiAlF_4$ coated, 20 cycles ALD LiF coated, 20 cycles ALD $AlF_3$ coated NMC-811 electrodes at $5^{th}$ cycle and $35^{th}$ cycle, respectively.

In FIG. 5, the rate performance of pristine and ALD coated NMC-811 electrodes are tested with an electrochemical window of about 2.75-4.50 V vs. $Li^+/Li$. At the lowest rate of about 20 mA/g, the discharge capacity of the pristine NMC-811 electrode quickly dropped from about 206.0 mAh/g to about 195.9 mAh/g within the first ten cycles. While cathodes with 20 cycles ALD LiF coating, $AlF_3$ coating and $LiAlF_4$ coating all showed improved stability, their specific capacities were different. With the highest lithium ion conductivity among the three, the $LiAlF_4$ coated electrode delivered an average capacity of about 197.7 mAh/g at about 20 mA/g during 1-10$^{th}$ cycle and about 147.6 mAh/g at about 200 mA/g during 31-41$^4$ cycle, both of which were close to or even higher than pristine NMC-811 (about 200.8 mAh/g at about 20 mA/g and about 142.0 mAh/g at about 200 mA/g). However, owing to the poor conductivity of LiF, a dense and uniform LiF coating on the surface of cathode materials would hinder lithium ion transport and cause polarization. The average capacities of LiF coated electrodes were about 170.8 mAh/g at about 20 mA/g during 1-10$^{th}$ cycle and about 94.5 mAh/g at about 200 mA/g during 31-41$^4$ cycle. While $AlF_3$ can be used as a coating layer to stabilize both anodes and cathodes in lithium ion batteries, the mechanism of how lithium ion conducts through the coating layer is not clear. For instance, $AlF_3$ may convert to $Li_3AlF_6$, LiF, Al and various $Li_xAl_y$ alloys on an anode depending on how low an equilibrium potential is applied (see supporting information for detailed calculation). In addition to the lithium ion conductivity provided by some of these products, the phase transformation itself may lead to a porous film, which allows lithium ions to pass through as well. However, the porosity of the film may lead to battery degradation by allowing interfacial reactions between an electrode and an electrolyte. On a cathode part, owing to the high operation voltage, it is unlikely for lithiation to take place in $AlF_3$ thermodynamically according to a thermodynamic calculation. As a result, a thicker coating can lead to higher overpotential and reduced capacity. This phenomenon becomes more substantial when metal fluoride is applied using ALD, which allows for conformity of coverage. The average capacities of $AlF_3$ coated electrodes were about 183.7 mAh/g at about 20 mA/g and about 106.0 mAh/g at about 200 mA/g. A similar phenomenon can be observed for other fluoride coating with five ALD cycles. A uniform ALD coating provides enhanced stability, but comes at the cost of serving as an additional lithium ion diffusion barrier. When the lithium ion conductivity of the film is low (such as LiF and $AlF_3$), such barrier leads to a high overpotential during cycling (FIGS. 5b and 5c) and thus a poor rate performance. The results show that having a stable and lithium ion conductive interfacial layer is desired.

Figure 6:
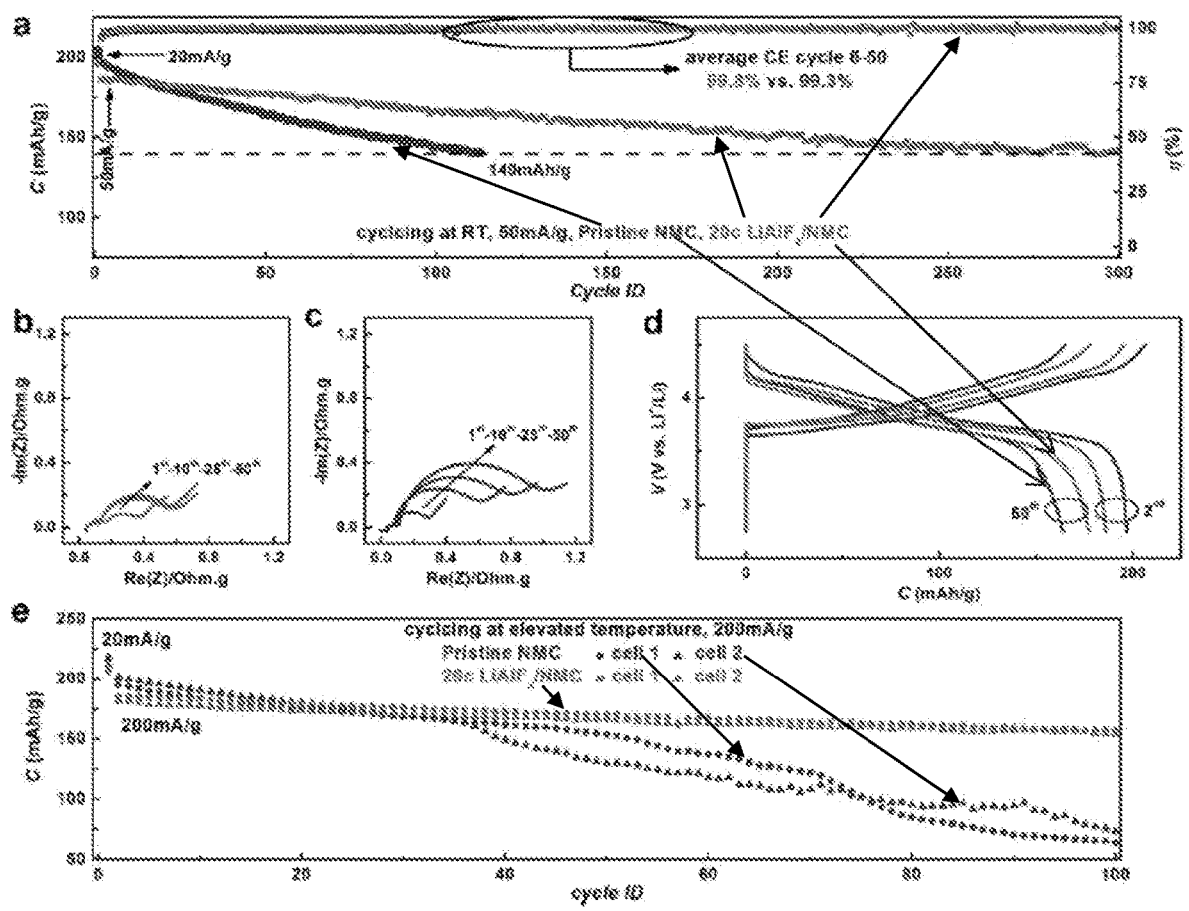
FIG. 6. (a) Cycle performance of pristine and 20 cycles ALD $LiAlF_4$ coated NMC-811 electrodes at room temperature with an electrochemical window of about 2.75-4.50 V vs. $Li^+/Li$; (b-c) EIS characterizations of pristine and 20 cycles ALD $LiAlF_4$ coated NMC-811 electrodes after $1^{st}$, $10^{th}$, $25^{th}$ and $50^{th}$ cycle; (d) voltage vs. capacity plots of pristine and 20 cycles ALD $LiAlF_4$ coated NMC-811 electrodes at $2^{nd}$ cycle and $50^{th}$ cycle; (e) cycle performance of pristine and 20 cycles ALD $LiAlF_4$ coated NMC-811 electrodes at elevated temperature with an electrochemical window of about 2.75-4.50 V vs. $Li^+/Li$.

The long-term stability of pristine and ALD $LiAlF_4$ coated NMC-811 electrodes was further analyzed using galvanostatic cycling at both room temperature and an elevated temperature (FIG. 6) at a wide electrochemical window of about 2.75-4.50 V vs. $Li^+/Li$. At room temperature, the electrode with $LiAlF_4$ coating maintained a capacity higher than about 140 mAh/g after 300 cycles (about 24% decay over 300 cycles or about 0.08% per cycle). For pristine NMC-811, the capacity dropped quickly to less than about 140 mAh/g after 113 cycles (about 29% decay over 113 cycles or about 0.26% per cycle). The average coulombic efficiency of the $LiAlF_4$ coated electrode was about 99.8%, compared to that of the pristine electrode of about 99.3%. The stability enhancement was universal among different samples tested (see supporting information for more details). Calculations show that $LiAlF_4$ is thermodynamically stable across the whole electrochemical window of operation, so it did not decompose when the cell was cycled to a high applied potential of about 4.5 V vs. $Li^+/Li$. The $LiAlF_4$ is also chemically resistant to trace amounts of HF in the electrolyte. It is believed that an accumulation of side product on an electrode-electrolyte interface may cause capacities to fade; with the aid of the stable interfacial layer, the growth of internal resistance is suppressed upon cycling. The impedance of coated samples showed little change (FIG. 6b) compared to steady increments of resistance for pristine samples (FIG. 6c). It is also noticed that the voltage hysteresis increased slower for coated samples when compared to pristine NMC-811 (FIG. 6d). High Ni content NMC electrodes can have poor stability at high temperature. Therefore, a galvanostatic cycling experiment is performed at an elevated temperature of about 50° C. to evaluate the temperature dependence of the coating performance. Owing to the enhanced lithium ion conductivity of both the coating layer and NMC-811 itself at elevated temperature, the cathode can be cycled at a higher rate of about 200 mAh/g (FIG. 6e). The capacities of pristine NMC-811 electrodes decayed fast to less than about 100 mAh/g within 100 cycles. Both ALD $LiAlF_4$ coated samples showed excellent capacity retention within 100 cycles.

To summarize, disclosed is the design and synthesis of a stable and lithium ion conductive $LiAlF_4$ interfacial layer on lithium ion battery cathodes using ALD. Calculations show that the fluoride-based interfacial layer is thermodynamically stable within a wide electrochemical window. The stable and lithium ion conductive interfacial layer improved the stability of high Ni content NMC-811 electrodes without sacrificing rate performance. If a stable interface between an electrode and an electrolyte can be achieved by rational materials design, lithium ion batteries with higher energy density and longer cycle life may find more applications including portable electronic, vehicle electrification, and grid scale energy storage and beyond.

Methods:
DFT Calculations

To derive the electrochemical window, calculation is first performed on the formation energy of crystalline LiAlF$_4$ and then the phase diagram building tool in the Materials Project (MP) database is used. To generate the stable LiAlF$_4$ structure, substitution of F for Cl is made in the stable LiAlCl$_4$ structure in the MP database (MPID mp-22983) and the lattice vectors and the positions of the ions are fully relaxed. The resulting formation energy is about $-3.55$ eV/atom. This value is calculated at 0 K and 0 atm and uses a reference energy of zero for the pure elements. According to the MP phase diagram for the Li—Al—F ternary system, LiAlF$_4$ is predicted to oxidize at a potential of about 5.72 V vs. Li/Li$^+$ according to the following reaction:

$$LiAlF_4 \rightarrow Li + 0.5F_2 + AlF_3$$

The reducing reaction is predicted to occur at a potential of about 2.05 V vs. Li/Li$^+$ according to the following reaction:

$$LiAlF_4 + Li \rightarrow \tfrac{2}{3}Li_3AlF_6 + \tfrac{1}{3}Al$$

For the DFT calculations, the Vienna Ab Initio Simulation Package (VASP) is used with the generalized gradient approximation (GGA) of Perdew-Burke-Ernzerhof (PBE) and the projector augmented wave (PAW) method. The following pseudopotentials are used: PAW_PBE Li_sv, PAW_PBE Cl, and PAW_PBE F. A plane wave cutoff energy of 520 eV, and k-mesh with a density of at least 1500/atom are used.

Materials Synthesis and Preparation

LiF deposition was performed using a Savannah S100 ALD system (Ultratech/Cambridge Nanotech). The LiF deposition includes alternating pulse and purge of lithium tert-butoxide (about 99%, Alfa Aesar) and TiF$_4$ (Sigma Aldrich) as precursors. TiF$_4$ was gently grinded prior to use. Typical pulse and purge durations for lithium tert-butoxide sub-cycle are about 1 s and about 15 s, respectively. Typical pulse and purge durations for TiF$_4$ sub-cycle are about 0.1 s and about 15 s, respectively. Lithium tert-butoxide was heated to about 160-170° C. and TiF$_4$ was kept at about 120-130° C. LiF thin films can be obtained at deposition temperatures ranging from about 200° C. to about 300° C. AlF$_3$ ALD deposition was performed flowing reported procedures. The AlF$_3$ deposition includes alternating pulse and purge of AlCl$_3$ (>about 99%, Sigma Aldrich) and TiF$_4$ as precursors. Typical pulse and purge durations for AlCl$_3$ sub-cycle are about 0.1 s and about 15 s, respectively. Typical pulse and purge durations for TiF$_4$ sub-cycle are about 0.1 s and about 15 s, respectively. Both AlCl$_3$ and TiF$_4$ precursors were kept at about 120-130° C. AlF$_3$ thin films can be obtained at a deposition temperature of about 250° C. LiAlF$_4$ ALD deposition was performed by alternating LiF and AlF$_3$ sub-cycles with about 1:1 ratio. LiAlF$_4$ thin films were obtained at about 250° C. High purity Argon gas was used as a carrier gas and a purging gas for all ALD processes mentioned above.

Materials Characterizations

SEM images were captured on FEI XL30 Sirion. XPS was performed on PHI 5000 VersaProbe, using an Al Kα ($\lambda$=about 0.83 nm, hυ=about 1486.7 eV) X-ray source operated at about 2 kV and about 20 mA. A Woollam M2000 Spectroscopic Ellipsometer was used for measuring and fitting optical properties of ALD thin films on silicon substrates with native oxides.

Electrochemical Measurements

EIS measurements were conducted using a Biologic VSP potentiostat over the frequency range of about 0.1 Hz to about 1 MHz in a temperature controlled environmental chamber (BTU-133, ESPEC North American, Inc.) from about 20 to about 90° C. and then about 80 to 0° C. LiAlF$_4$ thin film was deposited on a stainless steel (SS) spacer. A coin cell was then assembled with a piece of LiAlF$_4$/SS spacer as a working electrode and a piece of bare SS spacer as a counter electrode. A liquid electrolyte with about 1 M LiPF$_6$ in about 1:1 ethylene carbonate (EC) and diethyl carbonate (DEC) (BASF) was confined in between the two electrodes with a polyimide ring spacer.

NMC-811 powders were acquired from Li-Fun Tech. Battery cycling performance was evaluated by the galvanostatic cycling of coin cells with NMC-811 or coated NMC-811 as working electrodes and Li foils as counter electrodes. The working electrodes were made through typical slurry-making, drying and calendaring processes. LiF, AlF$_3$ and LiAlF$_4$ coatings were applied on NMC-811 directly using ALD. For coin cell testing, about 50 μL of about 1 M LiPF$_6$ in about 1:1 EC and DEC (BASF) was added as the electrolyte. Battery cycling data was collected using a LAND 8-channel battery tester at both room temperature and about 50° C. EIS measurements for both pristine NMC-811 and coated NMC-811 were also conducted for coin cells after certain numbers of cycles at room temperature.

Supplementary Information:
Additional Experimental Details
Materials Characterizations X-ray diffraction (XRD, PANalytical X'Pert Diffractometer) was used for phase identification using Cu Kα radiation of about 0.15406 nm. To measure the Ni, Mn and Co contents, NMC-811 powders were dissolved using aqua regia. The resulting solution was then diluted and tested using inductively coupled plasma-mass spectrometry (ICP-MS).

Prediction of Electrochemical Stability Window and Lithiation Potentials

Figure 7:
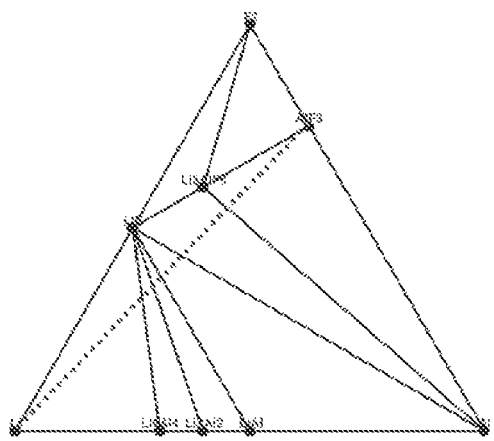
FIG. 7. Phase diagram of Li—Al—F and formation energies of various Li—Al—F compounds.

The phase diagram of Li—Al—F and formation energies of LiF, AlF$_3$, Li$_3$AlF$_6$, LiAl, Li$_3$Al$_2$ and Li$_9$Al$_4$ were acquired from the MP database (materialsproject.org) (FIG. 7). DFT calculation predicted a formation energy of about $-3.547$ eV/atom or about $-2053.4$ kJ/mol for LiAlF$_4$. It was more stable than LiAlCl$_4$ (about $-2.042$ eV/atom) but less stable than LiYF$_4$ (about $-4.059$ eV/atom). The calculated stability window was about 2.05-5.72 V vs. Li$^+$/Li for LiAlF$_4$ based on the anodic reaction (E1) and cathodic reaction (E2) listed below. The about 2.05-5.72 V vs. Li$^+$/Li electrochemical window is wider than the operation electrochemical windows of most cathodes typically used.

$$LiAlF_4 \rightarrow Li + 0.5F_2 + AlF_3 \quad E=5.72 \text{ V vs. Li}^+/\text{Li} \tag{E1}$$

$$LiAlF_4 + Li \rightarrow \tfrac{2}{3}Li_3AlF_6 + \tfrac{1}{3}Al \quad E=2.05 \text{ V vs. Li}^+/\text{Li} \tag{E2}$$

The electrochemical stability window of Li$_3$N, Li$_2$O, LiF, LiAlO$_2$ and Li$_3$PO$_4$ were calculated based on the same procedure described above. Their decomposition reactions were listed as below:

$$Li_3N \rightarrow 3Li + 0.5N_2 \quad E=0.61 \text{ V vs. Li}^+/\text{Li} \tag{E3}$$

$$Li_2O \rightarrow 2Li + 0.5O_2 \quad E=3.11 \text{ V vs. Li}^+/\text{Li} \tag{E4}$$

$$LiF \rightarrow Li + 0.5F_2 \quad E=6.36 \text{ V vs. Li}^+/\text{Li} \tag{E5}$$

$$LiAlO_2 \rightarrow 0.8\,Li + 0.2LiAl_5O_8 + 0.2O_2 \quad E=3.70 \text{ V vs. Li}^+/\text{Li} \tag{E6}$$

$$LiAlO_2 + 2.25Li \rightarrow 0.5Li_5AlO_4 + 0.25Li_3Al_2 \quad E = 0.17 \text{ V vs. } Li^+/Li \quad (E7)$$

$$Li_3PO_4 \rightarrow Li + 0.5Li_4P_2O_7 + 0.25O_2 \quad E = 4.21 \text{ V vs. } Li^+/Li \quad (E8)$$

$$Li_3PO_4 + 8Li \rightarrow 4Li_2O + Li_3P \quad E = 0.69 \text{ V vs. } Li^+/Li \quad (E9)$$

According to these decomposition reactions, it is concluded that the electrochemical stability windows for the following compounds are as follows: $Li_3N$ (about 0-0.61 V vs. $Li^+/Li$), $Li_2O$ (about 0-3.11 V vs. $Li^+/Li$), LiF (about 0-6.36 V vs. $Li^+/Li$), $LiAlO_2$ (about 0.17-3.70 V vs. $Li^+/Li$) and $Li_3PO_4$ (about 0.69-4.21 V vs. $Li^+/Li$).

Five degradation reactions are thermodynamically possible when $AlF_3$ was applied as a protection film in lithium ion batteries.

$$AlF_3 + 1.5Li \rightarrow 0.5Li_3AlF_6 + 0.5Al \quad E = 1.28V \text{ vs. } Li^+/Li \quad (E10)$$

$$0.5Li_3AlF_6 + 0.5Al + 1.5Li \rightarrow 3LiF + Al \quad E = 1.06V \text{ vs. } Li^+/Li \quad (E11)$$

$$3LiF + Al + Li \rightarrow 3LiF + LiAl \quad E = 0.36V \text{ vs. } Li^+/Li \quad (E12)$$

$$3LiF + LiAl + 0.5Li \rightarrow 3LiF + 0.5Li_3Al_2 \quad E = 0.19V \text{ vs. } Li^+/Li \quad (E13)$$

$$3LiF + 0.5Li_3Al_2 + 0.75Li \rightarrow 3LiF + 0.25Li_9Al_4 \quad E = 0.07V \text{ vs. } Li^+/Li \quad (E14)$$

Depending on the exact applied potential, it is thermodynamically possible for $AlF_3$ to convert to other phases (such as $Li_3AlF_6$ and $Li_xAl_y$ alloys). These phases may have high intrinsic lithium ion conductivity and porous structures due to volume change upon phase transformation, both of which can facilitate lithium ion transport across a film. However, $AlF_3$ film remains intact on a cathode and it should not be lithiated according to the calculation.

XPS Analysis of ALD LiF and $AlF_3$ Films

Figure 8:
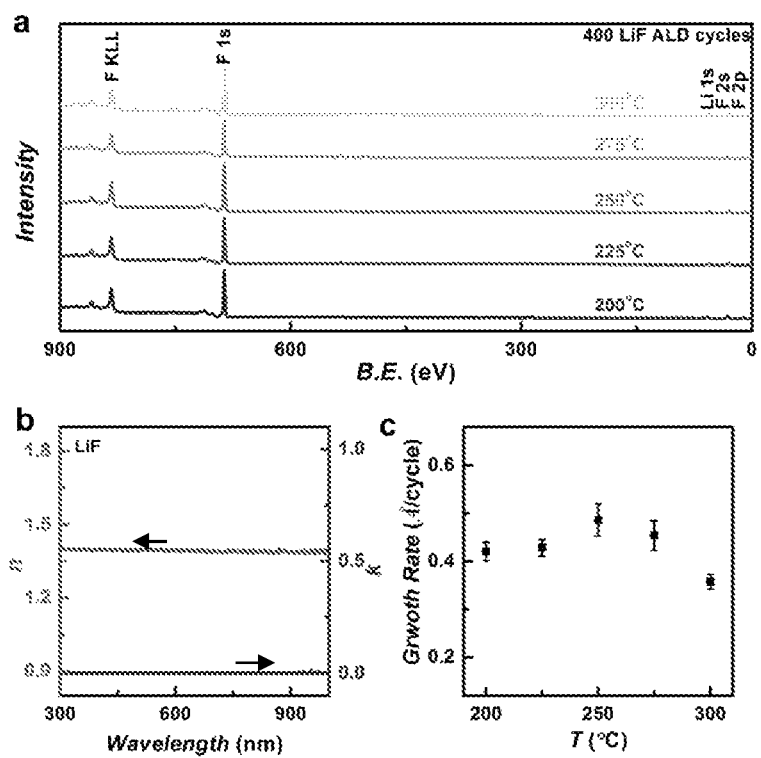
FIG. 8. (a) XPS characterizations of ALD LiF films grown at different temperatures; (b) refractive index (n) and extinction coefficient (k) of ALD LiF film; (c) growth rate per cycle of ALD LiF at different temperatures.

ALD LiF films can be obtained at a temperature range from about 200 to about 300° C. The as-prepared films were characterized by XPS, which displayed distinct Li and F peaks (FIG. 8a). The thicknesses of LiF films were measured using an ellipsometer. The refractive index of ALD LiF was close to about 1.4 and the extinction coefficient was close to 0 (FIG. 8b). The highest deposition rate of about 0.5 Å/cycle was achieved at a deposition temperature of about 250° C. (FIG. 8c).

Figure 9:
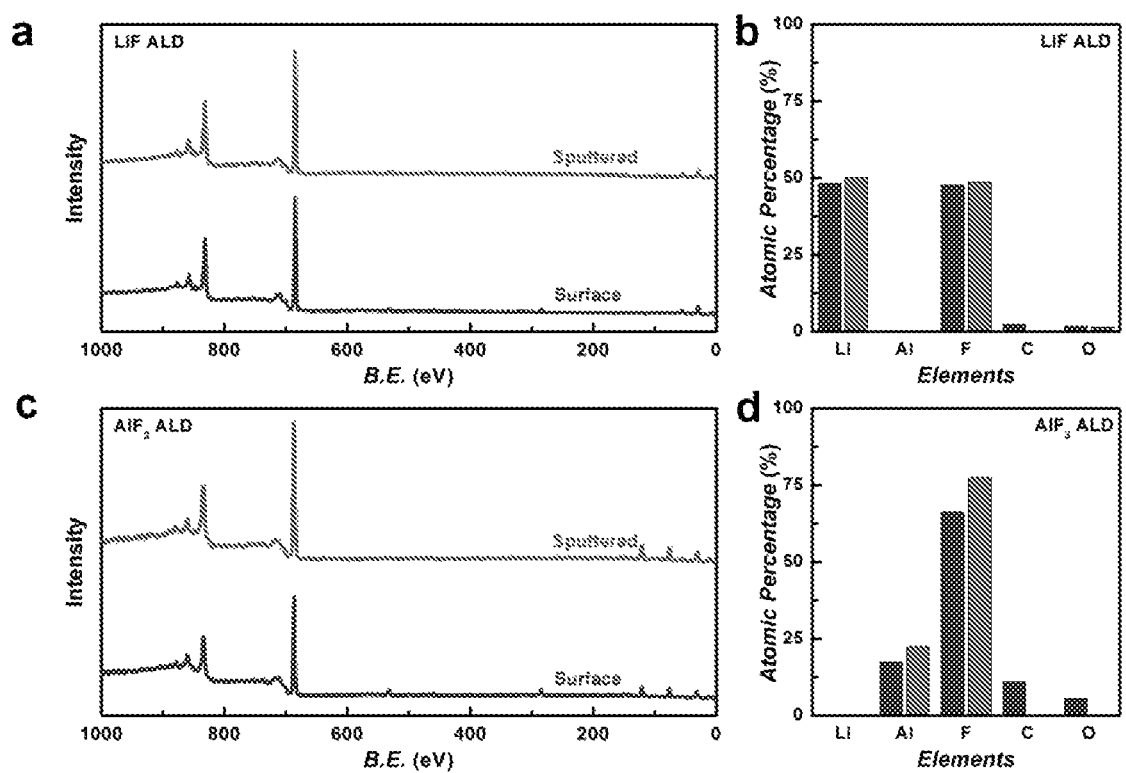
FIG. 9. (a) XPS characterizations of ALD LiF before and after sputtering; (b) chemical compositions of ALD LiF film analyzed by XPS; (c) XPS characterizations of ALD $AlF_3$ before (left bar) and after sputtering (right bar); (d) chemical compositions of ALD $AlF_3$ film analyzed by XPS before (left bar) and after sputtering (right bar).

XPS characterizations were carried out for both LiF and $AlF_3$ films (FIGS. 9a and 9c). There were C and O impurities presumably absorbed on the surfaces of both films before sputtering (FIGS. 9b and 9d). The C and O contents were higher on $AlF_3$ than those on LiF, which might be explained by the hygroscopic nature of $AlF_3$. XPS characterizations were then carried out for both films after sputtering (FIGS. 9a and 9c). The intensities of both C and O peaks were reduced after mild sputtering (FIGS. 9b and 9d). While the Li:F atomic ratio in ALD LiF film obtained was close to its stoichiometry value of 1 (Li:F=about 1:0.97), the ALD $AlF_3$ film showed excess of F with Al:F atomic ratio being about 1:3.45. Different ALD processes may yield films with different Al:F ratios.

EIS Characterizations of $LiAlF_4$ Film from about 80° C. to 0° C.

Figure 10:
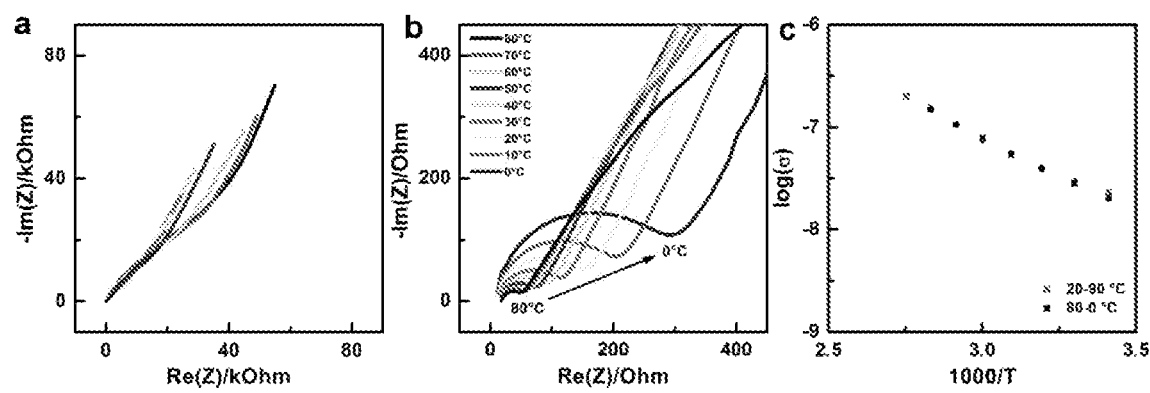
FIG. 10. (a, b) Lithium ion conductivity measurements using EIS; (c) conductivity vs. temperature plot of LiAlF$_4$ film.

EIS spectra were also recorded for $LiAlF_4$ film by decreasing testing temperatures from about 80 to 0° C. (FIGS. 10a and 10b). The calculated lithium ion conductivities and activation energy were similar compared to the numbers acquired by increasing temperatures from about 20 to about 90° C. (FIG. 10c).

SEM, XRD and ICP-MS Characterizations of NMC-811 Powder

Figure 11:
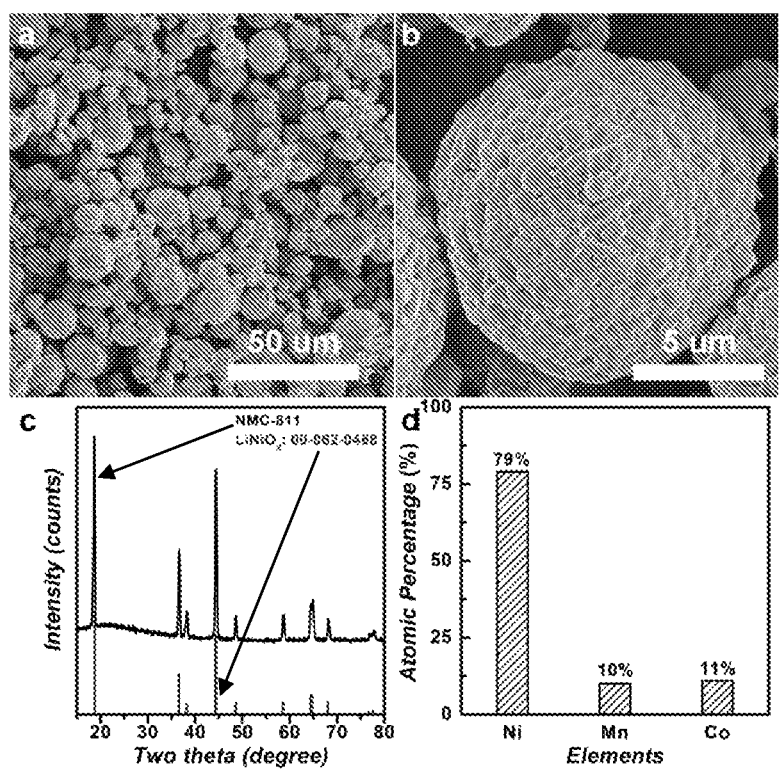
FIG. 11. (a, b) SEM characterizations of NMC-811; (c) X-ray diffraction (XRD) characterization of pristine NMC-811; (d) Inductively coupled plasma-mass spectrometry (ICP-MS) characterization of pristine NMC-811.

FIGS. 11a and 11b show the morphology of NMC-811 powders used. XRD characterization confirmed that the NMC-811 particle is of single phase (FIG. 11c). The Ni:Mn:Co atomic ratio is about 0.79:about 0.10:about 0.11 according to ICP-MS (FIG. 11d).

Cycle Stability of NMC-811 at Different Electrochemical Windows

Figure 12:
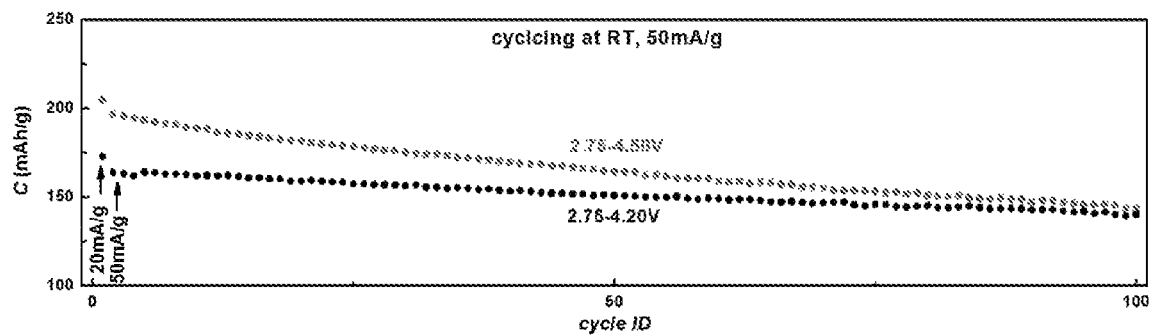
FIG. 12. (a) Cycle performance of pristine NMC-811 electrodes at room temperature with electrochemical windows of about 2.75-4.20 V and about 2.75-4.50 V vs. Li$^+$/Li.

High nickel content NMC-811 can exhibit instability when cycled to high cut-off potentials. In FIG. 12, long-term cycle stability of pristine NMC-811 is tested with different electrochemical windows. The one cycled to about 4.2 V vs. $Li^+/Li$ has a lower initial specific capacity, but a higher capacity retention than the one cycled to about 4.5 V vs. $Li^+/Li$.

Figure 13:
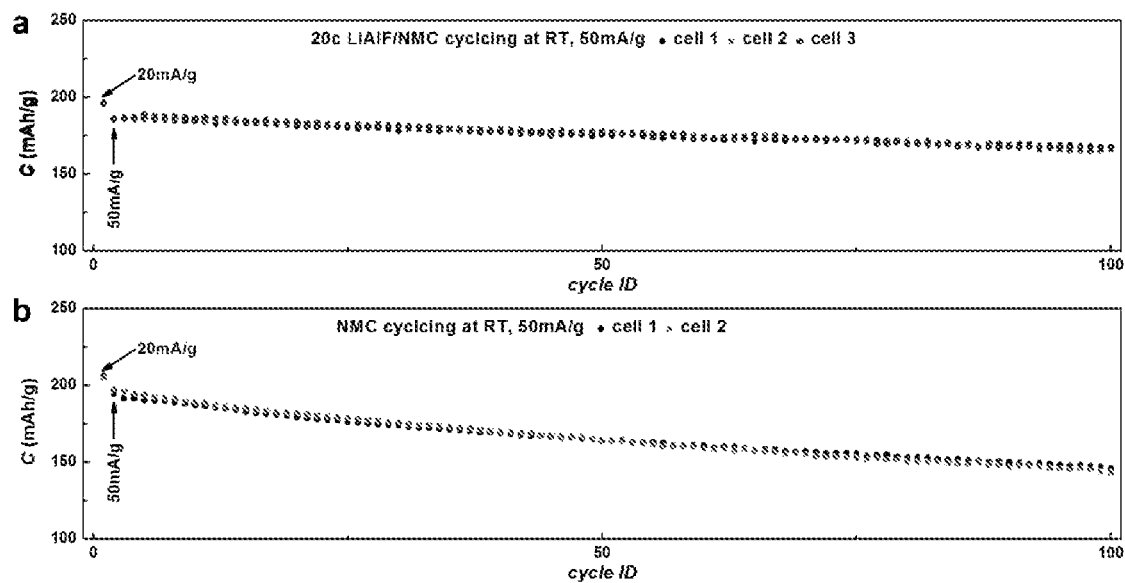
FIG. 13. (a) Cycle performance of 20 cycles ALD LiAlF$_4$ coated NMC-811 electrodes with an electrochemical window of about 2.75-4.50 V vs. Li$^+$/Li at room temperature. Three cells were tested at about 50 mA/g. (b) Cycle performance of pristine NMC-811 electrodes with an electrochemical window of about 2.75-4.50 V vs. Li$^+$/Li at room temperature. Two cells were tested at about 50 mA/g.

Cycle Stabilities of Multiple $LiAlF_4$ Coated NMC-811 and Pristine NMC-811 Samples Multiple cells with and without ALD coating have been tested to confirm the effectiveness of coating layer in enhancing cathode stability (FIG. 13). Three cells were tested for $LiAlF_4$ coated NMC-811 and show similar stabilities in the range of 100 cycles. Two cells were tested for pristine NMC-811 and also show similar stabilities in the range of 100 cycles.

Summary of Cycle Stability of NMC-811 of this Example and Reported Values

TABLE 1

Stability of NMC-811 in this example compared to reported values.

| Test conditions | Capacity retention | Additional comments | Source |
|---|---|---|---|
| 3.0-4.3 V, ½ C | 70.2%, 100 cycles (99.65% per cycle) | | Reported |
| 3.0-4.4 V, ⅓ C | 74%, 57 cycles, (99.47% per cycle) | | Reported |
| 2.7-4.5 V, ⅓ C | 64%, 100 cycles, (99.55% per cycle) | | Reported |
| 2.7-4.6 V, ½ C | 48%, 100 cycles (99.27% per cycle) | | Reported |
| 2.75-4.50 V, ¼ C | 76%, 300 cycles (99.91% per cycle) | ALD $LiAlF_4$ NMC-811 | This example |

High Ni content NMC (e.g., NMC-811) can exhibit instability compared to lithium cobalt oxide (LCO) or low Ni content NMC. Depending on cathode preparation methods and detailed cycle conditions, capacity retentions per cycle are often in the range of about 99.3%-about 99.6%. For pristine NMC-811, the capacity retention per cycle decreased significantly with increased cut-off potentials. With ALD $LiAlF_4$ coating, the capacity retention per cycle is improved to higher than about 99.9% at a wide electrochemical widow of about 2.75-4.50 V vs. $Li^+/Li$. Further optimization of $LiAlF_4$ ALD (chemical composition, lithium ion conductivity and thickness) may yield higher stability.

As used herein, the singular terms "a," "an," and "the" may include plural referents unless the context clearly dictates otherwise. Thus, for example, reference to an object may include multiple objects unless the context clearly dictates otherwise.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the term "size" refers to a characteristic dimension of an object. Thus, for example, a size of an object that is circular or spherical can refer to a diameter of the object. In the case of an object that is non-circular or non-spherical, a size of the object can refer to a diameter of a corresponding circular or spherical object, where the corresponding circular or spherical object exhibits or has a particular set of derivable or measurable characteristics that are substantially the same as those of the non-circular or non-spherical object. When referring to a set of objects as having a particular size, it is contemplated that the objects can have a distribution of sizes around the particular size. Thus, as used herein, a size of a set of objects can refer to a typical size of a distribution of sizes, such as an average size, a median size, or a peak size.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While this disclosure has been described with reference to the specific embodiments thereof, it should be understood by those skilled in the art that various changes may be made and equivalents may be substituted without departing from the true spirit and scope of this disclosure as defined by the appended claims. In addition, many modifications may be made to adapt a particular situation, material, composition of matter, method, operation or operations, to the objective, spirit and scope of this disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of this disclosure. Accordingly, unless specifically indicated herein, the order and grouping of the operations are not a limitation of this disclosure.

What is claimed is:

1. A coated cathode material comprising:
a cathode active material having a high nickel content of at least about 75% by atomic ratio, wherein the cathode active material is comprised of nickel-containing particles each having a size of about ten microns or less; and
an interfacial layer coating the nickel-containing particles of the cathode active material,
wherein the interfacial layer includes a lithium-containing fluoride, wherein the lithium-containing fluoride contains lithium and at least one additional metal different from lithium, and wherein the interfacial layer is configured to provide an interface between the cathode active material having high nickel content and an electrolyte.

2. The coated cathode material of claim 1, wherein the lithium-containing fluoride is a compound of lithium, fluorine, and the additional metal.

3. The coated cathode material of claim 1, wherein the additional metal is aluminum.

4. The coated cathode material of claim 3, wherein the lithium-containing fluoride is a lithium aluminum fluoride.

5. The coated cathode material of claim 4, wherein the lithium aluminum fluoride is represented as $Li_xAl_yF_z$ where $0.5 \leq x \leq 3.5$, $0.5 \leq y \leq 1.5$, and $3.5 \leq z \leq 6.5$.

6. The coated cathode material of claim 4, wherein an atomic ratio of lithium to aluminum is about 1.

7. The coated cathode material of claim 4, wherein an atomic ratio of lithium to aluminum is greater than 1.

8. The coated cathode material of claim 4, wherein an atomic ratio of fluorine to lithium is greater than 1.

9. The coated cathode material of claim 1, wherein the lithium-containing fluoride has a lithium ion conductivity of at least $1 \times 10-10$ S/cm.

10. The coated cathode material of claim 1, wherein the lithium-containing fluoride has a reduction potential no greater than 2.8 V vs. Li/Li+.

11. The coated cathode material of claim 1, wherein the lithium-containing fluoride has an oxidation potential of at least 4.5 V vs. Li/Li+.

12. The coated cathode material of claim 1, wherein the cathode active material is a layered lithium transition metal oxide.

13. The coated cathode material of claim 1, wherein the nickel-containing particles each have a dimension in a range of 10 nm to 10 μm.

14. The coated cathode material of claim 1, wherein a thickness of the interfacial layer is in a range of 1 nm to 200 nm.

15. A cathode for a lithium ion battery, comprising a current collector and the coated cathode material of claim 1 disposed adjacent to the current collector.

16. A method of forming a coated cathode material, comprising:
providing a cathode active material having a high nickel content of at least about 75% by atomic ratio, wherein the cathode active material is comprised of nickel-containing particles each having a size of about ten microns or less; and
forming, via atomic layer deposition, an interfacial layer coating the nickel-containing particles of the cathode active material,
wherein the interfacial layer includes a lithium-containing fluoride, wherein the lithium-containing fluoride contains lithium and at least one additional metal different from lithium, and wherein the interfacial layer is configured to provide an interface between the cathode active material having high nickel content and an electrolyte.

17. The method of claim 16, wherein the interfacial layer includes a lithium aluminum fluoride.

18. The method of claim 17, wherein forming the interfacial layer includes:
performing a first atomic layer deposition cycle to deposit a lithium-containing fluoride; and
performing a second atomic layer deposition cycle to deposit an aluminum-containing fluoride.

19. The coated cathode material of claim 1, wherein the nickel-containing particles each have a dimension in a range of 500 nm to 1 μm.

\* \* \* \* \*